(12) United States Patent
Lee et al.

(10) Patent No.: US 7,948,792 B1
(45) Date of Patent: May 24, 2011

(54) MEMORY AND TECHNIQUES FOR USING SAME

(75) Inventors: Andy L. Lee, San Jose, CA (US); Lu Zhou, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 217 days.

(21) Appl. No.: 12/424,362

(22) Filed: Apr. 15, 2009

(51) Int. Cl.
G11C 11/00 (2006.01)
G11C 7/10 (2006.01)
G06F 7/38 (2006.01)

(52) U.S. Cl. .................. 365/154; 365/156; 365/189.08; 326/40

(58) Field of Classification Search .................. 365/154
See application file for complete search history.

(56) References Cited

U.S. PATENT DOCUMENTS

| | | | |
|---|---|---|---|
| 5,754,063 A | 5/1998 | Lee | |
| 6,028,809 A | 2/2000 | Schleicher et al. | |
| 6,115,312 A * | 9/2000 | Jefferson et al. | 365/228 |
| 6,128,215 A | 10/2000 | Lee | |
| 6,172,900 B1 * | 1/2001 | Mejia | 365/154 |
| 6,353,551 B1 | 3/2002 | Lee | |
| 6,515,508 B1 | 2/2003 | Chang et al. | |
| 6,842,039 B1 | 1/2005 | Guzman et al. | |
| 6,842,040 B1 | 1/2005 | Chang et al. | |
| 6,876,572 B2 * | 4/2005 | Turner | 365/156 |
| 6,882,205 B2 * | 4/2005 | Curran et al. | 327/291 |
| 6,940,307 B1 * | 9/2005 | Liu et al. | 326/38 |
| 6,943,580 B2 | 9/2005 | Lewis et al. | |
| 6,965,249 B2 | 11/2005 | Lane et al. | |
| 7,023,744 B1 * | 4/2006 | Shimanek et al. | 365/189.11 |
| 7,103,813 B1 | 9/2006 | Tracy et al. | |
| 7,167,022 B1 | 1/2007 | Schleicher et al. | |
| 7,196,542 B1 | 3/2007 | Lee et al. | |
| 7,200,020 B2 * | 4/2007 | Ramaraju et al. | 365/189.15 |
| 7,215,140 B1 | 5/2007 | Saini et al. | |
| 7,312,632 B2 | 12/2007 | Lewis et al. | |
| 7,358,764 B1 * | 4/2008 | Chan et al. | 326/38 |
| 7,391,236 B2 | 6/2008 | Lewis et al. | |
| 7,400,167 B2 | 7/2008 | Lewis et al. | |
| 7,430,148 B2 * | 9/2008 | Liu et al. | 365/226 |
| 7,463,057 B1 * | 12/2008 | Rahim et al. | 326/38 |
| 7,800,400 B2 * | 9/2010 | Rahim et al. | 326/38 |
| 2001/0006348 A1 | 7/2001 | Jefferson et al. | |
| 2001/0048320 A1 | 12/2001 | Lee et al. | |
| 2002/0041191 A1 | 4/2002 | Reddy et al. | |
| 2002/0057121 A1 | 5/2002 | Lee | |
| 2002/0084801 A1 | 7/2002 | Jefferson et al. | |
| 2002/0156797 A1 | 10/2002 | Lee et al. | |
| 2002/0163356 A1 | 11/2002 | Lee et al. | |
| 2002/0163358 A1 | 11/2002 | Johnson et al. | |
| 2002/0166106 A1 | 11/2002 | Lewis et al. | |
| 2003/0033584 A1 | 2/2003 | Zaveri et al. | |
| 2003/0076130 A1 | 4/2003 | Reddy et al. | |
| 2003/0080778 A1 | 5/2003 | Jefferson et al. | |
| 2003/0097628 A1 | 5/2003 | Ngo et al. | |
| 2003/0201794 A1 | 10/2003 | Reddy et al. | |
| 2003/0237071 A1 | 12/2003 | Lee et al. | |

(Continued)

Primary Examiner — Son L Mai
(74) Attorney, Agent, or Firm — Fletcher Yoder PC

(57) ABSTRACT

There are provided methods and devices for providing overdrive voltages to address lines to help prevent leakage current in semiconductor memories, such as configuration memories used with programmable logic devices. Specifically, for example, there is provided a memory that includes an array of memory cells. Each memory cell includes a retainer circuit. An access transistor is coupled to the retainer circuit. An overdrive voltage level may be applied to the access transistor.

22 Claims, 11 Drawing Sheets

U.S. PATENT DOCUMENTS

| | | |
|---|---|---|
| 2004/0108871 A1 | 6/2004 | Johnson et al. |
| 2005/0127944 A1 | 6/2005 | Lewis et al. |
| 2006/0017460 A1 | 1/2006 | Lewis et al. |
| 2006/0033527 A1 | 2/2006 | Lee et al. |
| 2006/0208785 A1 | 9/2006 | Lee et al. |
| 2007/0008000 A1 | 1/2007 | Lee et al. |
| 2007/0040576 A1 | 2/2007 | Lewis et al. |
| 2007/0200596 A1 | 8/2007 | Lee et al. |
| 2007/0252617 A1 | 11/2007 | Lewis et al. |
| 2007/0283193 A1 | 12/2007 | Lewis et al. |
| 2008/0052569 A1 | 2/2008 | Ngo et al. |
| 2008/0068230 A1 | 3/2008 | Yao et al. |
| 2008/0169836 A1 | 7/2008 | Rahim et al. |
| 2008/0231316 A1 | 9/2008 | Lewis et al. |
| 2008/0263481 A1 | 10/2008 | Lewis et al. |
| 2008/0263490 A1 | 10/2008 | Lewis et al. |

* cited by examiner

Clear

Write "1"

Verify "0"

Verify "1"

MEMORY AND TECHNIQUES FOR USING SAME

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

The present disclosure relates generally to the field of semiconductor memories, and more particularly to memories used in programmable integrated circuits such as programmable logic devices (PLDs), which are commonly referred to as field programmable gate arrays (FPGAs).

As the name suggests, PLDs are electronic devices that may be programmed to perform a specific function or functions. FPGAs are one common type of PLD that use a grid of logic blocks that may be programmed to perform relatively advanced logic functions. FPGAs may be used in a wide variety of applications, including digital signal processing, computer hardware emulation, and high performance computing, for example. Indeed, FPGAs may find particular utility in telecommunications applications, consumer electronics, medical and test equipment, military applications, and industrial electronics. FPGAs are typically programmed or configured each time they are powered up, typically using a configuration memory. The configuration memory stores the programming for the FPGA and is typically random access memory, such as static random access memory (SRAM). As such, it is commonly referred to as configuration random access memory or "CRAM."

Some of the challenges faced in designing CRAM include guaranteeing an acceptable write margin, read margin and leakage margin. Write margin refers to the ability of data line drivers to successfully overwrite the contents of each CRAM memory cell by driving the data line to logic "0" as the address line of the CRAM cell is asserted. Read margin refers to the ability for an address line transistor of the CRAM cell to pull-down the precharged data line (held high by the data line retainer) when the address line is asserted. Leakage margin refers to the ability of the data line retainer to keep the precharged data line held to logic "1" while the off-state address line transistors of all CRAM cells connected to that data line are leaking current during an off-state.

Historically, off-state leakage current was not large and, therefore, the leakage margin was not difficult to achieve. However, as the dimensions of the memory cells have decreased with advances such as 65 nm and 45 nm processing technologies, off-state leakage current has grown and, correspondingly, guaranteeing the leakage margin has become difficult. In particular, the larger leakage requires that the data line retainer be made stronger. However, if the data line retainer is made too strong, it becomes difficult for the CRAM memory cells to meet the read margin requirements. As smaller dimensions of the CRAM memory cells are achieved, guaranteeing read margin while at the same time guaranteeing leakage margins becomes even more difficult as the memory cells can possibly have worst-case local variation for read margin (meaning weak address transistor) while at the same time having worst-case local variation for leakage margin (meaning strong address transistor for higher off-state leakage). Traditionally, if meeting read margins did not allow a strong enough data line retainer to meet leakage margins, the only solution was to reduce the number of memory cells connected to each data line. This meant segmenting the data lines more often and adding more-frequent data line buffers, thus increasing the die area to be resolved.

SUMMARY

Certain aspects discussed in detail in the following disclosure are summarized below. It should be understood that these aspects are presented merely to provide the reader with a brief summary of certain examples discussed herein and that these aspects are not intended to limit the scope of the invention. Indeed, the invention may encompass a variety of aspects that may not be set forth below.

A configuration memory, such as may be used with a FPGA, includes a plurality of address lines that may be used to select memory cells for programming and subsequent reading. More specifically, each of the address lines is coupled to a gate of an address line transistor that provides access to its respective memory cell. When the memory cell is in a read mode, referred to herein as a user mode, the off-state of the address line transistor may be overdriven in order to reduce its off-state leakage current. For example, if the address line transistor is an NMOS transistor having a logical "0" off-state, the voltage value of the logical "0" may be slightly negative. In another example, if the address line transistor is a PMOS transistor having a logical "1" off-state, the logical "1" value may be slightly above a corresponding positive voltage rail for the address line transistor.

A CRAM memory cell, as described above, may have different voltage levels applied to it depending upon whether it is being programmed, referred to herein as a configuration mode, or whether it is in the user mode. For example, the voltage levels used in the configuration mode may be selected to optimize write margin levels, while the voltage levels used in the user mode may be selected to reduce or eliminate off-state leakage current of the address line transistor and/or to protect the reliability of the memory cell.

A circuit may be utilized to select the various voltages used in the configuration mode and the user mode. In one embodiment, multiplexors are used to receive alternate voltages that may be used in the configuration mode and the user mode. In the configuration mode, a logic circuit selects one of the voltages to be transmitted to the memory cell, and in the user mode the logic circuit selects the alternate voltages to be transmitted to the memory cell.

A level shifting circuit may be utilized to receive the selected voltages and deliver the voltages to CRAM memory cell. In one embodiment, a two-stage level shifting circuit is used. The first stage delivers the upper rail voltages and the second stage delivers the lower rail voltages, where each of the upper rail voltages and lower rail voltages may differ between the configuration mode and the user mode.

BRIEF DESCRIPTION OF THE DRAWINGS

Certain embodiments are described by example in the following detailed description and in reference to the drawings in which.

DETAILED DESCRIPTION

Figure 1:
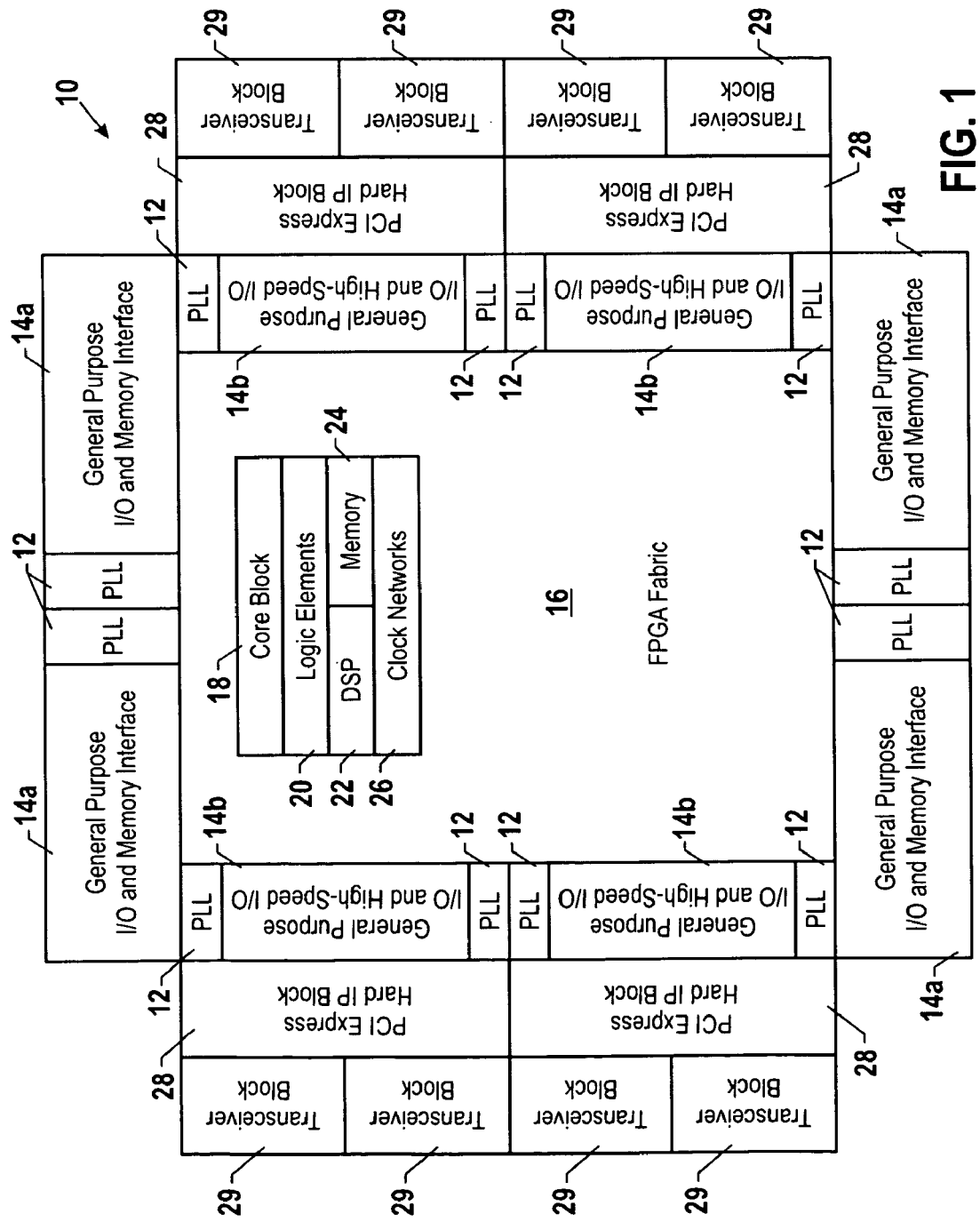
FIG. 1 is a block diagram of a field programmable gate array in accordance with an embodiment of the present disclosure.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The memories and techniques described herein are provided by way of example in the context of a configuration memory for use with a programmable integrated circuit, such as a PLD. However, it should be understood that the memories and techniques may be readily applicable to a variety of other types of circuits, such as general purpose microprocessors, complex programmable logic devices (CPLD), erasable programmable logic devices (EPLD), electrically erasable programmable logic devices (EEPLD), field programmable gate arrays (FPGA), application-specific standard products (ASSP), application-specific integrated circuits (ASIC), and other suitable integrate circuits.

To facilitate operation of a semiconductor memory, such as a configuration memory for a PLD, having reduced off-state leakage current, address line transistors may be overdriven, i.e., provided with voltage levels beyond conventional rail voltage levels. For example, the logic "0" value of an address line may be driven to a slightly negative voltage if an address line transistor is an NMOS transistor to reduce or eliminate the off-state leakage current of the configuration memory address line transistors. Alternatively, if the address line transistor is a PMOS transistor, the logic "1" value of the address line may be driven above the positive voltage rail level for the PMOS transistor. This reduces the current leakage on each data line by orders of magnitude and allows the data line driver to be much weaker since the configuration leakage to be overcome is much weaker.

The techniques described by way of example below may be used in conjunction with any suitable PLD, such as an FPGA, having its configuration memory based on SRAM. For example, these techniques may be used in FPGAs available from Altera Corporation, such as the Altera Stratix® IV GX chip which is generally described below in FIG. 1. As briefly mentioned above, FPGAs may be used in a variety of electronic devices. In computer and storage applications, for example, FPGAs may be used to facilitate the implementation of PCI Express. For document imaging, FPGAs may be used to implement image processing and CODEC algorithms. In medical and testing equipment, manufacturers often move from ASICs to FPGAs to reduce development costs and time to market, to increase flexibility for design changes, and to enable field changes. Military applications often require robust security, and FPGAs are often used for IP encryption. However, it should be understood that FPGAs may be used in a wide variety of devices and that these are merely examples of certain applications in which FPGAs may be used.

Referring to FIG. 1, a block diagram of an example FPGA 10 is illustrated in accordance with an embodiment of the present disclosure. The FPGA 10 has phase lock loops (PLLs) 12 and I/O blocks 14 that help the FPGA 10 integrate and communicate with other devices and systems. Specifically, the PLLs 12 may support spread-spectrum input clocking, programmable bandwidth, clock switchover, dynamic reconfiguration, and delay compensation, to help synchronize the FPGA 10 with other component parts, devices or systems. The I/O blocks 14, which may include general purpose I/O and memory interface blocks 14A and general purpose I/O and high speed I/O blocks 14B, may be configured in banks of 24 to 48 I/O blocks and may support industry I/O standards for single-ended, differential, voltage-referenced single-ended and differential I/O standards so that the FPGA may communicate with other devices using industry standard communication protocols. Additionally, the I/O blocks 14 may also support high speed differential I/O and/or, in some embodiments, the FPGA 10 may be configured with physical layer support for gigabit Ethernet, XAUI/HiGig and other protocols.

An array of programmable logic is located in the FPGA 10 and constitutes a FPGA fabric 16. The FPGA fabric 16 includes a core block 18 that may have logic elements 20, digital signal processing (DSP) 22, memory 24, and clock networks 26, among other things. The logic elements 20, DSP 22, memory 24 and clock networks 26 may be user configurable so that the FPGA 10 may perform specific functions. In some embodiments, the logic elements 20 may be packaged in adaptive logic modules (ALMs) with ten ALMs in a logic array block (LAB). The FPGA 10 may also include communication circuitry, such as PCI express/hard IP blocks 28 and transceiver blocks 29.

The memory 24 may include memory for use as CRAM for the FPGA 10. Static RAM (SRAM) is conventionally used as CRAM but other types of memory may also be used, such as erasable programmable read-only memory (EPROM), Flash memory, and electrically erasable programmable read-only memory (EEPROM). Because SRAM is a volatile memory, the SRAM is re-programmed during each start-up of the FPGA 10, since data is lost when a power is removed from the memory. The operation of the CRAM is discussed in greater detail below.

Figure 2:
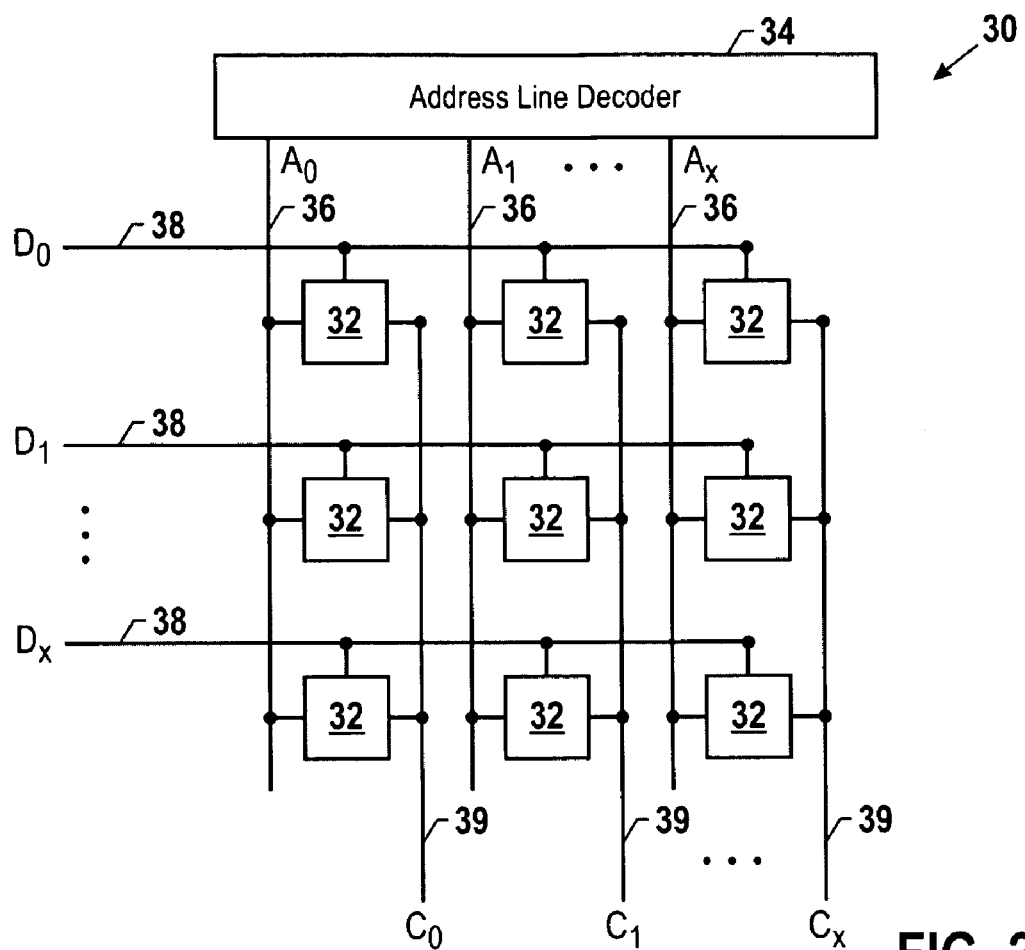
FIG. 2 illustrates a simplified configuration random access memory (CRAM) array in accordance with an embodiment of the present disclosure.

A simplified block diagram of a CRAM 30 is illustrated in FIG. 2. The CRAM 30 includes individual memory cells 32. The CRAM 30 is programmed in a random access manner, as described in detail below. The address lines 36 (A0, A1 and Ax) may be provided from an address line decoder 34 to control an address transistor (not shown) for each memory cell 32 via a data line driver 37. The data lines 38 (D0, D1 and Dx) provides data to the memory cells 32. The clear lines 39 (C0, C1 and Cx) are used to clear the memory cells 32. Input data to memory cells 32 is driven onto the horizontal data lines 38 that drive the data into each memory cell 32. Addressing the cells 32 is done by vertical address lines 36, which select or address each cell 32. A frame includes all the cells 32 sharing a common address line 36. To program a frame of configuration data, the programming data is driven on the horizontal data lines 38, and the vertical address line 36 is asserted to write data into the frame.

Figure 3:
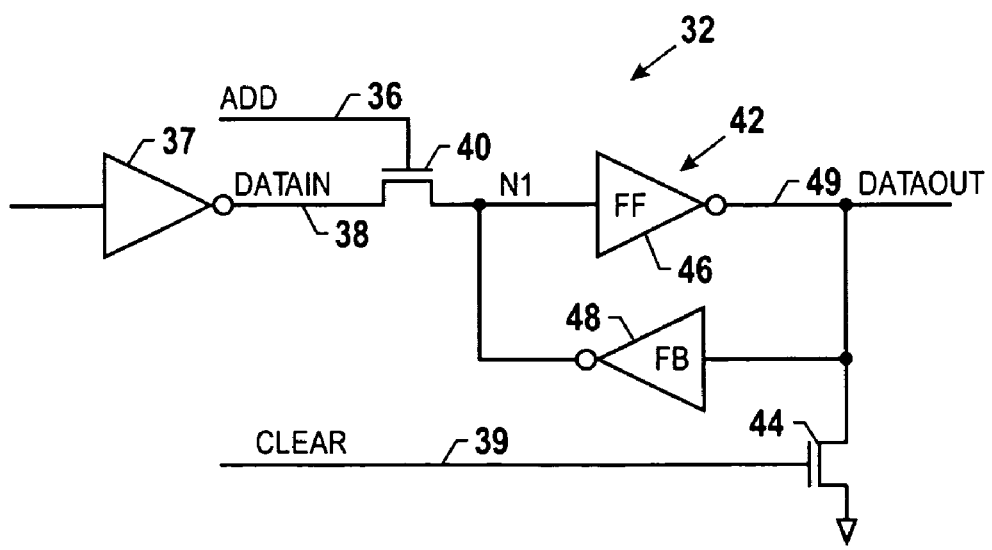
FIG. 3 illustrates a schematic diagram of a memory cell of the CRAM array of FIG. 2 in accordance with an embodiment of the present disclosure.

The general manner in which the memory cells 32 are configured may be described by way of example with reference to FIGS. 3, 4A-E, and 5. FIG. 3 schematically illustrates a memory cell 32 that includes an address line transistor 40, a dual inverter memory retainer circuit 42, and a clear transistor 44. The dual inverter memory retainer circuit 42 includes a first inverter 46 and a second inverter 48 that are coupled together in a serial loop arrangement. In this example, both the address line transistor 40 and the clear transistor 44 are NMOS transistors, but either or both of these transistors could be PMOS transistors given certain variations of the present technique as described in greater detail below. In the presently described embodiment, the gate of the address line transistor 40 is coupled to one of the address lines ADD 36. The source of the address line transistor 40 is coupled to one of the data lines DATAIN 38, and the drain of the address line transistor 40 is coupled to a node N1 that connects the output of the second inverter 48 to the input of the first inventor 46. The output of the first inverter 46 serves as the data output DATAOUT 49 of the memory cell 32, and it is coupled to the input of the second inverter 48, as well as to the source of the clear transistor 44. Finally, the gate of the clear transistor 44 is coupled to one of the clear lines 39, the source of the clear transistor 44 is coupled to ground, and the drain of the clear transistor 44 is coupled to data output DATAOUT 49.

Figure 4A:
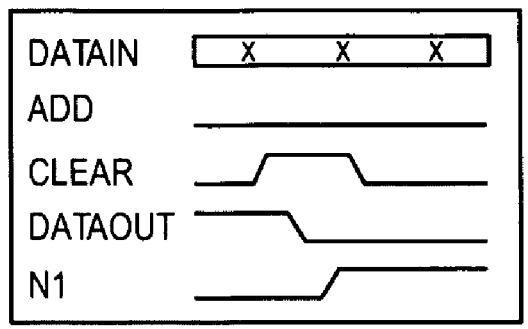
FIGS. 4A-4D illustrate timing diagrams relating to the memory cell of FIG. 3 for clearing, writing a logical "1", verifying a logical "0", and verifying a logical "1", respectively.

In the present embodiment, when the FPGA 10 is started or powered up, the memory cells 32 are first placed into a configuration mode in which they are initialized and programmed, and may be verified, prior to the memory cells 32 being placed into a user mode in which the contents of the memory cells 32 may be read in order to perform the logical functions of the FPGA 10. An example of how these processes may be performed will be described in reference to the timing diagrams illustrated in FIGS. 4A-4E and the flowchart 50 illustrated in FIG. 5. In this example, when the FPGA 10 is started up (block 52), it is placed into the configuration mode (block 54). Once in the configuration mode, the CRAM memory cells may be initialized (block 56). To initialize the CRAM memory cells, the CLEAR signal is asserted on line 39 to turn on the clear transistor 44, which connects the data output DATAOUT 49 of the memory cell 32 to ground. As illustrated in FIG. 4A, it does not matter whether a logical "1" or a logical "0" is present on the data line DATAIN 38, and the address line ADD 36 is held to a logical "0" during the initialization operation. Hence, even if a logical "1" is being stored on the memory cell 32, the assertion of the CLEAR signal causes the voltage to drop to ground, e.g., logical "0", across the clear transistor 44. This brings the node N1 to a logical "1", thus resetting the contents of the memory cell 32 to a logical "0".

It should be appreciated that the CRAM 30 of the FPGA 10 may be fairly large and that the current generated by clearing all the CRAM memory cells 32 at the same time may therefore be excessive. Hence, the assertion of the CLEAR signal may be done in a staged manner, such that only a portion of the CRAM memory cells 32 are cleared on each cycle of an internal clock that controls the CLEAR signal. By initializing the CRAM memory cells 32 in a staged manner, the generated current may thereby be spread out over time.

Figure 4B:
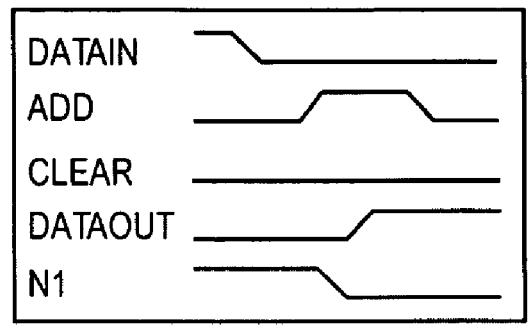

Once the CRAM memory cells 32 have been initialized, the CRAM memory cells 32 may be programmed (block 58). Since all the CRAM memory cells 32 in this embodiment are initialized to a logical "0", only logical "1"s need to be programmed into the CRAM memory cells 32. Referring now to FIG. 4B, programming a logical "1" into the CRAM memory cell 32 of FIG. 3 may be accomplished by driving the data line DATAIN 38 to a logical "0" and then strobing the address line ADD 36 briefly to a logical "1". The strobing of the address line ADD 36 causes the logical "0" from the data line DATAIN 38 to be transferred to the node N1, which in turn causes the first inverter 42 to output a logical "1" at its output DATAOUT 49. Since the CLEAR signal on the line 39 is not asserted, the second inverter 48 outputs a logical "0" on node N1 to complete the logical data loop. It should be noted that the CRAM memory cell 32 is designed so that a logical "1" on the data line DATAIN 38 cannot overwrite the contents of the CRAM memory cell 32.

Figure 4C:
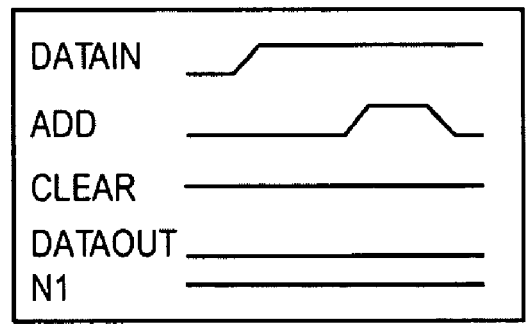
Figure 4D:
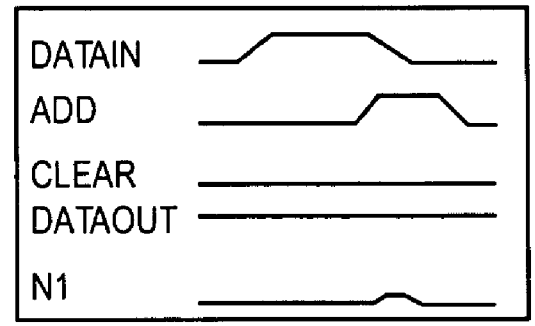
Figure 5:
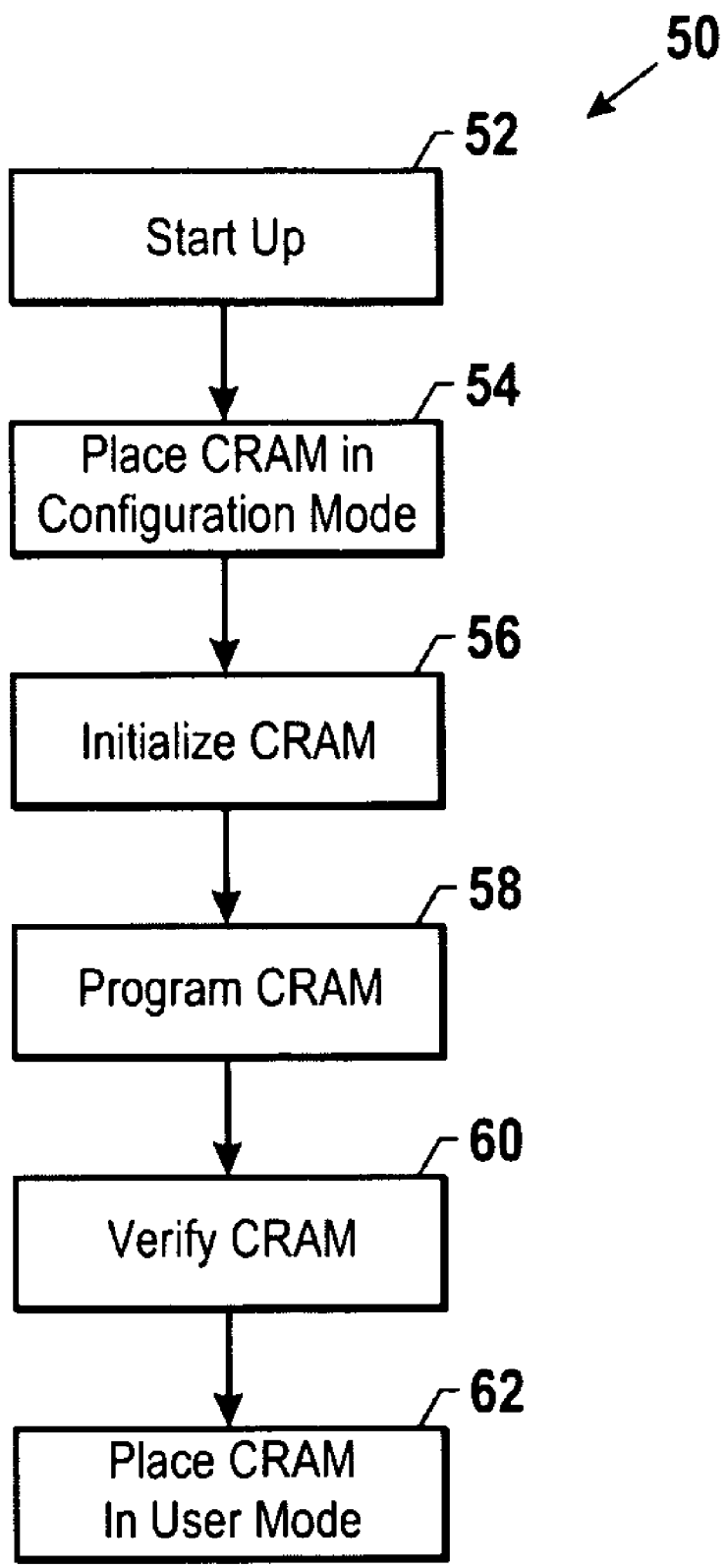
FIG. 5 illustrates a flow chart corresponding to the operation of the memory cell illustrated in FIG. 3.

After the CRAM memory cells 32 have been programmed, it may be desirable to verify the CRAM memory cells 32 to determine whether they properly store either a logical "0" or a logical "1" (block 60). To verify the contents of each CRAM memory cell 32, the data line DATAIN 38 may be pre-charged to a logical "1", and then the data line driver 37 may be tri-stated. As illustrated in FIGS. 4C and 4D, by strobing the address line ADD 36, the data line DATAIN 38 will remain at logical "1" if the CRAM memory cell 32 is storing a logical "0", or it will be driven to a logical "0" if the CRAM memory cell 32 is storing a logical "1". The resulting values on the data lines 38 for each memory cell 32 may then be checked to ensure that the CRAM memory cells 32 contain the properly programmed values. Once the CRAM memory cells 32 of the CRAM 30 have been properly programmed, the CRAM 30 may be placed in a user mode (block 62). In the user mode, the contents of the CRAM 30 may be used so the FPGA 10 can perform the appropriate logical functions as determined by the proper programming of the CRAM 30.

Now that the basic functions of the CRAM 30 and its memory cells 32 have been described, the manner in which the off-state leakage current may now be better understood. First, it should be appreciated that the actual voltage values of the logical "1" and logical "0" signals described above may be different from one device to another, e.g., the value of a logical "1" on the address line transistor 40 may be different from the value of a logical "1" on the clear transistor 44. Second, the actual voltage values representing a logical "1" and/or a logical "0" may be different depending upon whether the CRAM memory cell 32 is in the configuration mode or the user mode. Third, the actual voltage value of the positive and/or negative voltage rails may be different from one device to another, e.g., the voltage rails for the data line driver 37 may be different from the voltage rails for the inverters 46 and 48. Finally, it should be appreciated that the actual voltage values for the positive and/or negative voltage rails may be different depending upon whether the CRAM memory cell 32 is in the configuration mode or the user mode. Indeed, it is through the selection of the actual voltage values of the logical signals and the voltage rails that the previously discussed margins may be reached while reducing off state current leakage, as described in detail below.

Figure 6:
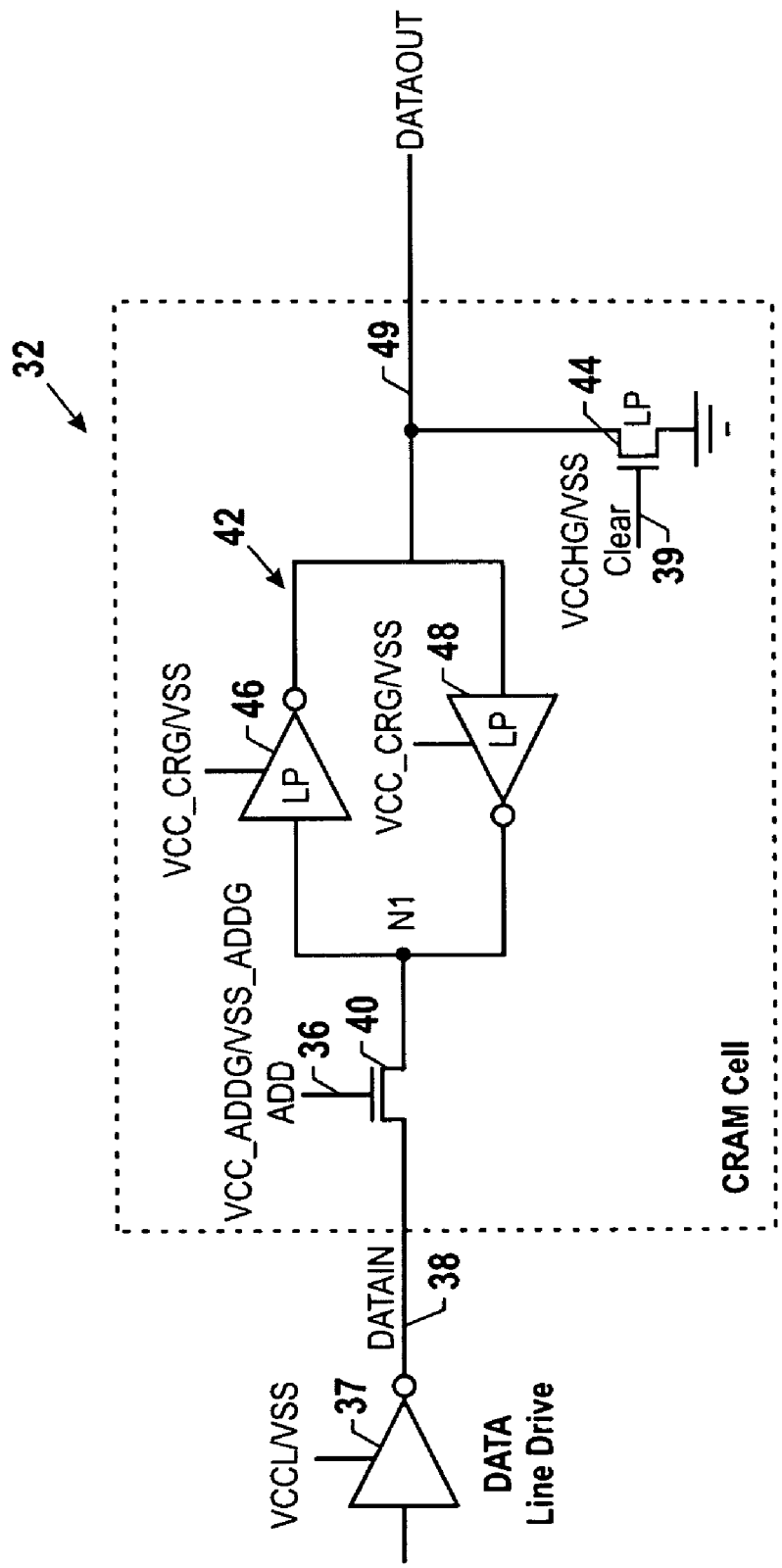
FIG. 6 illustrates the memory cell of FIG. 3 in greater detail.

FIG. 6 illustrates a more detailed view of the memory cell 32, and it can be seen that this view includes nomenclature designating voltage values for the positive/negative voltage rails for the data line driver 37 and the inverters 46 and 48, as well as nomenclature representing the logical "1"/logical "0" values for the signals on the address line ADD 36 and the CLEAR line 39. More specifically, the data line driver 37 has positive and negative rail voltages of VCCL and VSS, respectively, and the first and second inverters 46 and 48 have positive and negative rail voltages of VCC_CRG and VSS, respectively, while the values for a logical "1" and logical "0" on the address line ADD 36 are VCC_ADDG and VSS_ADDG, respectively, and the logical "1" and "0" values on the CLEAR line 39 are VCCHG and VSS, respectively. Using the nomenclature for these voltage values, it should be appreciated that these respective values may differ from one another in any given mode and/or may differ depending upon whether the CRAM memory cell 32 is in the configuration mode or the user mode.

One reason that these voltages may differ relates to a desire to reduce the current leakage of the address line transistor 40 of each CRAM memory cell 32 when the address line transistor 40 is off during the user mode. To reduce this off-state current leakage, it is desirable to overdrive the logical value on the address line transistor 40 that places it in its off-state in order to substantially or completely cut off the channel of the transistor 40 to reduce its off-state leakage. The examples disclosed in the present embodiment illustrate the address line transistor 40 as being an NMOS transistor. As such, the address line transistor 40 is placed in its OFF state by a logical "0". Therefore, in the illustrated embodiments, the actual voltage value of the logical "0" for the address line transistor when in the user mode should be driven to a slightly negative voltage value, and it will be appreciated that the magnitude of the negative voltage value in any given circumstance may depend on various factors, including the dimensions and other characteristics of the address line transistor 40, reliability of the transistor 40 to negative voltages, and the amount of off-state current leakage reduction desired. Of course, the present techniques are also applicable to other embodiments, such as where the address line transistor 40 may be a PMOS transistor. In this case, the address line transistor 40 would be placed in its off-state using a logical "1", so off-state current leakage would be reduced by overdriving the positive voltage level slightly above a corresponding rail voltage to substantially or completely cut off the channel of the PMOS transistor 40.

By overdriving the address line transistor 40 in the manner described above, the off-state leakage current from the address line transistor 40 can be greatly reduced or eliminated. This allows the data line driver 37 to be much weaker, since the leakage current it must overcome is much weaker. As a result, it is much easier for the CRAM read margin to be met because the data line retainer can be weaker. However, there may be practical limits to the amount that the address line transistor 40 should be overdriven. In keeping with the illustrated embodiment in which the address line transistor 40 is an NMOS transistor, the current drops exponentially compared to the value of the negative voltage applied, so relatively small negative voltages produce relatively large reductions in leakage current. Further, once leakage current is completely eliminated, increasing the magnitude of the negative voltage produces no further benefits. Second, negative voltages can increase the likelihood of reliability concerns. For example, if a negative voltage is placed on the gate of an NMOS transistor while the drain of the transistor is held at a relatively high positive voltage rail, the drain-to-gate voltage across the transistor could be unusually high, thus creating the possibility of breakdown. Hence, it may be desirable not only to overdrive the address line transistor 40 to reduce leakage current, but also to adjust appropriate rail voltages to ensure that drain-to-gate levels remain in an acceptable range.

In light of these various considerations, different logical and/or rail voltages may be used in the configuration and user modes as described below with respect to Table 1. As can be seen, the positive rail voltage for the data line driver 37 remains at VCCL in both the configuration and user modes, and similarly, the logical "1" voltage level for the CLEAR transistor 44 remains at VCCHG in both the configuration and user modes. However, the positive rail voltage VCC_CRG for the first and second inverters 46 and 48 changes from VCCL in the configuration mode to VCCHG in the user mode. Further, both the logical "1" and logical "0" levels applied to the address line transistor 40 differ from the configuration mode to the user mode. Specifically, in the configuration mode, the logical "1" level VCC_ADDG is VCCHG and the logical "0" level VCC_ADDG is VSS, while in the user mode, the logical "1" level VCC_ADDG is VCCL, and the logical "0" level VCC_ADDG is VSSADDG.

TABLE 1

| CRAM Operation Mode | Data Line Driver Voltage | VCC_CRG Voltage | VCC_ADDG Voltage | VSS_ADDG Voltage | Clear Driver Voltage |
|---|---|---|---|---|---|
| Configuration | VCCL | VCCL | VCCHG | VSS | VCCHG |
| User Mode | VCCL | VCCHG | VCCL | VSSADDG | VCCHG |

Figure 7:
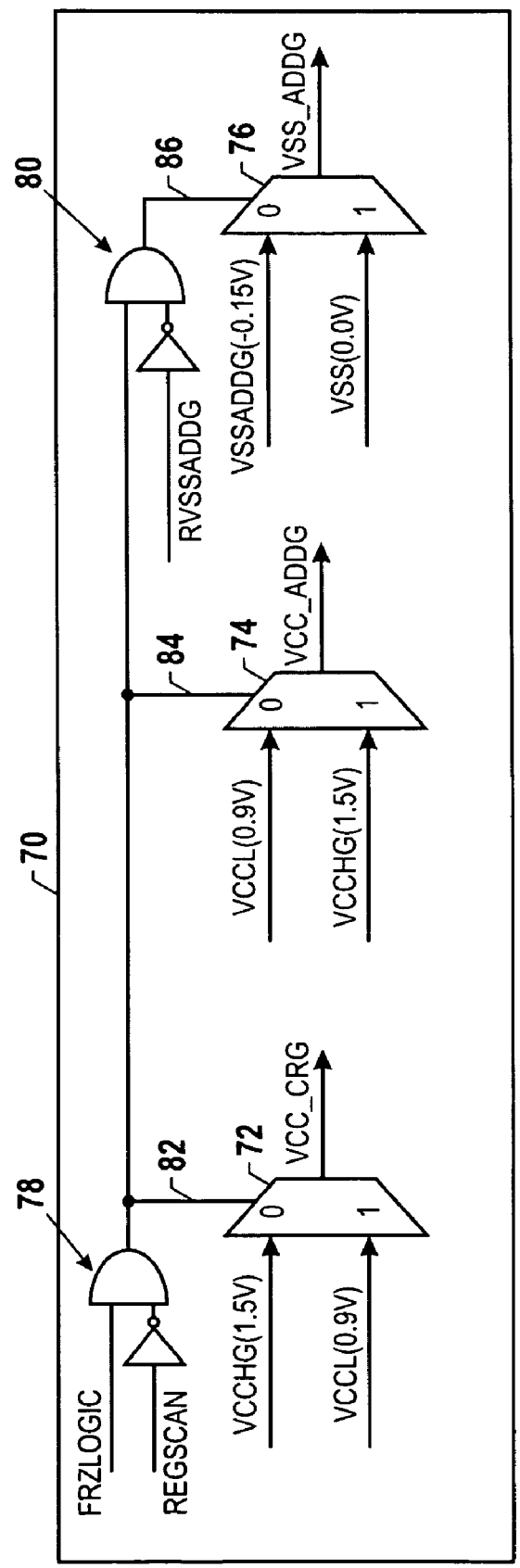
FIG. 7 illustrates a circuit used to select voltages for use in the CRAM voltage supply and the CRAM address line voltages of the memory cell illustrated in FIG. 6.

Any suitable method may be used for generating and/or selecting the different voltages between the configuration mode and the user mode. However, in the present embodiment, a selection circuit having a series of multiplexors may be used to select amongst various different voltage levels based upon whether the CRAM memory cell 32 is in the configuration mode or the user mode. As illustrated in FIG. 7, a selection circuit 70 may include a series of multiplexors 72, 74, and 76, controlled by logical circuits 78 and 80. In this embodiment, the 0 and 1 inputs of the multiplexors 72, 74, and 76 are selected by a corresponding logical 0 or 1, respectively, on their respective select lines 82, 84, and 86. In the configuration mode, the FRZLOGIC line is a logical "1," the REGSCAN line is a logical "0," and the RVSSADDG line is a logical "0." Thus, in the configuration mode, the logical circuit 78 outputs a logical "1" which selects the voltage VCCL to be placed on any VCC_CRG input, and which selects the voltage VCCHG to be placed on any VCC-ADDG input. Similarly, the logic circuit 80 outputs a logical "1" which selects the voltage VSS to be placed on any VSS_ADDG input. In the user mode, the FRZLOGIC line is a logical "0," the REGSCAN line is a logical "0," and the RVSSADDG line is a logical "0." Thus, in the user mode, the logic circuit 78 outputs a logical "0" which selects the voltage VCCHG to be placed on any VCC_CRG input, and which selects the voltage VCCL to be placed on any VCC_ADDG input. Similarly, the logic circuit 80 outputs a logical "0" which selects the voltage VSSADDG to be placed on any VSS_ADDG input.

Figure 8:
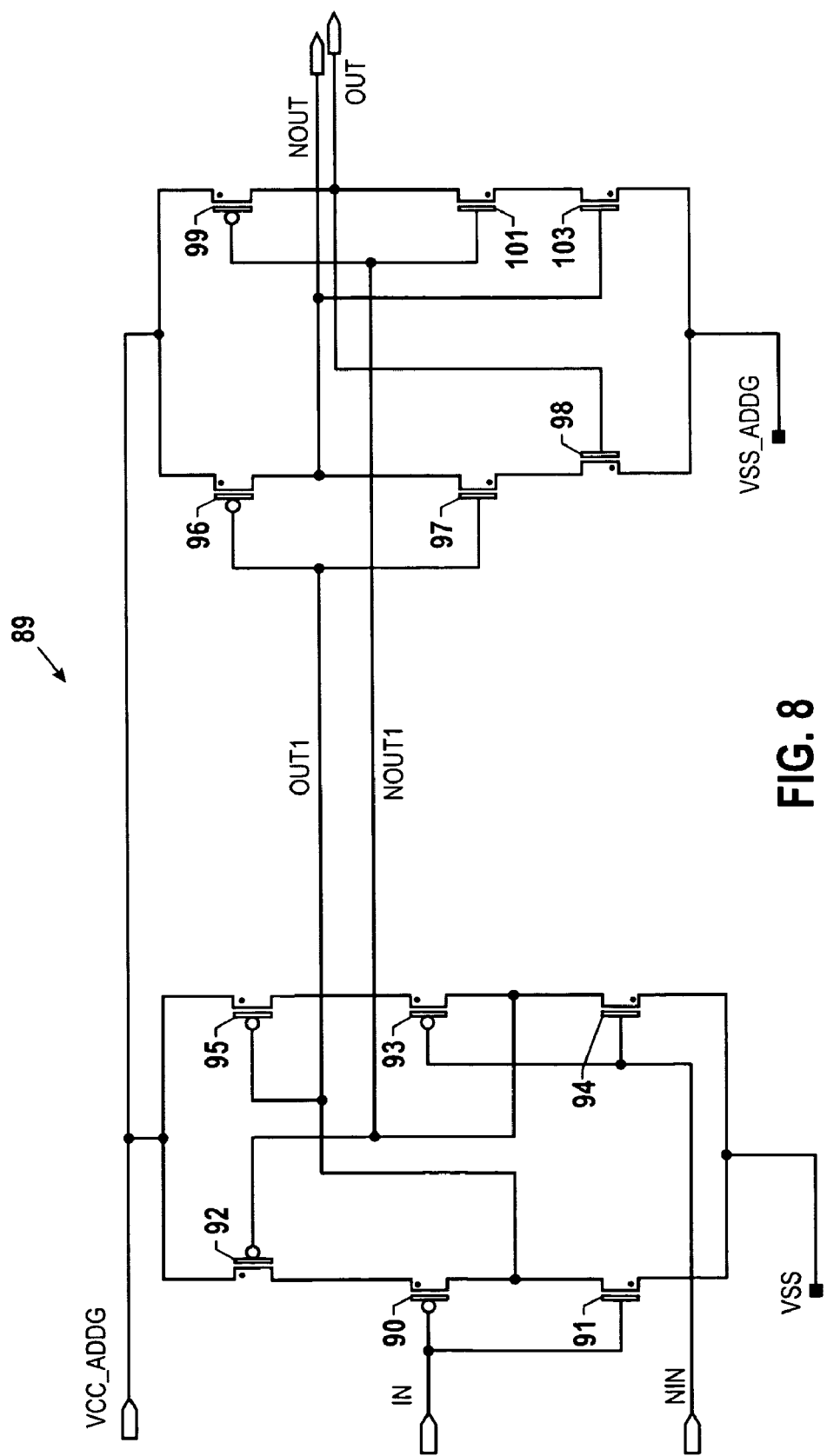
FIG. 8 illustrates a schematic diagram of an example of a level shifting circuit that may be used in conjunction with the circuit of FIG. 7.

The voltages output by the selection circuit 70 may be received by a level shifting circuit 89, and example of which is illustrated in FIG. 8. This particular example is a two-stage level shifter, with transistors 90-95 forming the first stage and transistors 96-103 forming the second stage. As can be seen, the variable voltage VCC_ADDG is input to both stages, and it changes from VCCHG in the configuration mode to VCCL in the user mode. The variable voltage VSS_ADDG is input to the second stage, and it changes from VSS in the configuration mode to VSSADDG in the user mode.

In the first stage, the input voltage at the node IN is a logical "1," such as 0.9V, and the input voltage at the node NIN is a logical "0," such as 0V. The voltage on the node IN causes the transistor 90 to turn off and the transistor 91 to turn on, which causes the voltage VSS (a logical "0" at 0V, to be placed on the output OUT1. The voltage on the node NIN causes the transistor 93 to turn on and the transistor 94 to turn off. With the logical "0" on the output OUT1, the transistor 95 turns on to couple the voltage on VCC_ADDG to the output NOUT1. Since the voltage value on VCC_ADDG is either VCCHG (in configuration mode) or VCCL (in user mode), it has a value of logical "1," so the transistor 92 turns off.

In the second stage, the input voltage at the node NOUT1 is a logical "1," and the input voltage at the node OUT1 is a logical "0." The voltage on the node OUT1 causes the transistor 96 to turn on and the transistor 97 to turn off, which causes the voltage VCC_ADDG to be placed on the output NOUT. The voltage on the node NOUT1 causes the transistor 101 to turn on and the transistor 99 to turn off. With the logical "1" on the output NOUT, the transistor 103 turns on to couple the voltage on VSS_ADDG to the output OUT. Since the voltage value on VSS_ADDG is either VSS (in configuration mode) or VSSADDG (in user mode), it has a value of logical "0," so the transistor 98 turns off. Hence, the second stage of the level shifting circuit 89 places the voltage VCC_ADDG onto the output NOUT and places the voltage VSS_ADDG onto the output OUT, which may be coupled to the memory cell 32.

Figure 9:
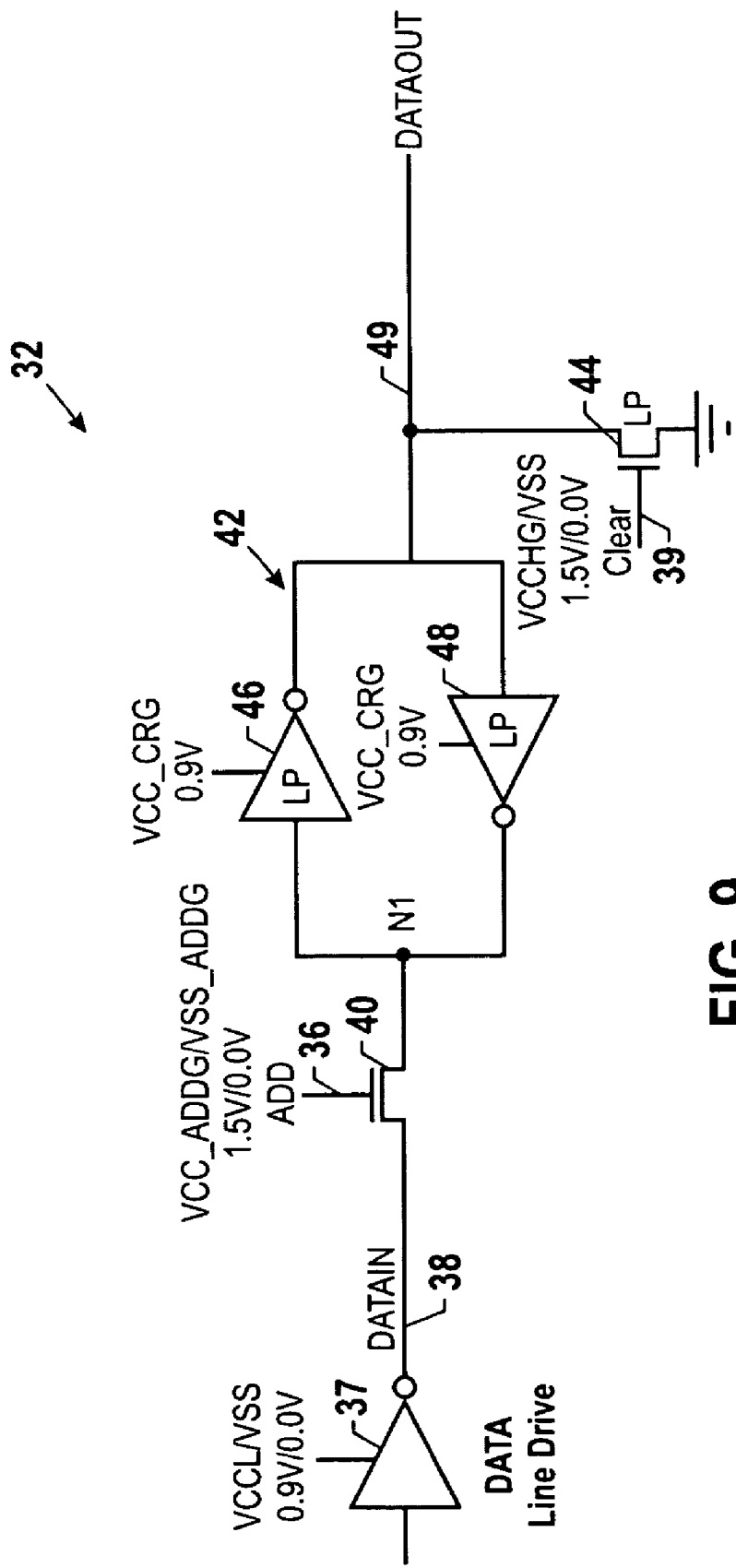
FIG. 9 illustrates the memory cell of FIG. 6 with an example of specific voltages used when the memory cell is in a configuration mode.
Figure 10:
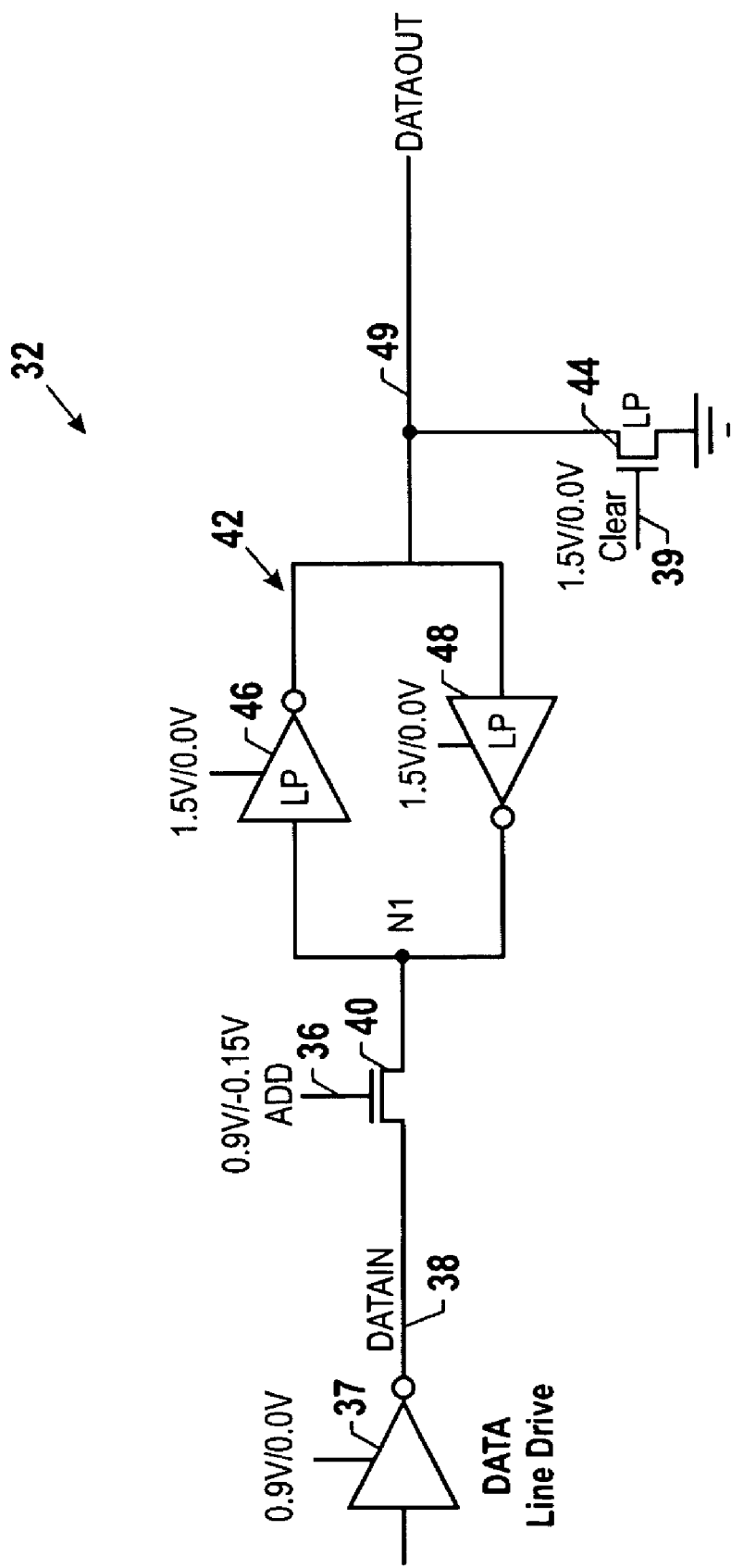
FIG. 10 illustrates the memory cell of FIG. 6 with an example of specific voltages used when the memory cell is in a user mode.
Figure 11:
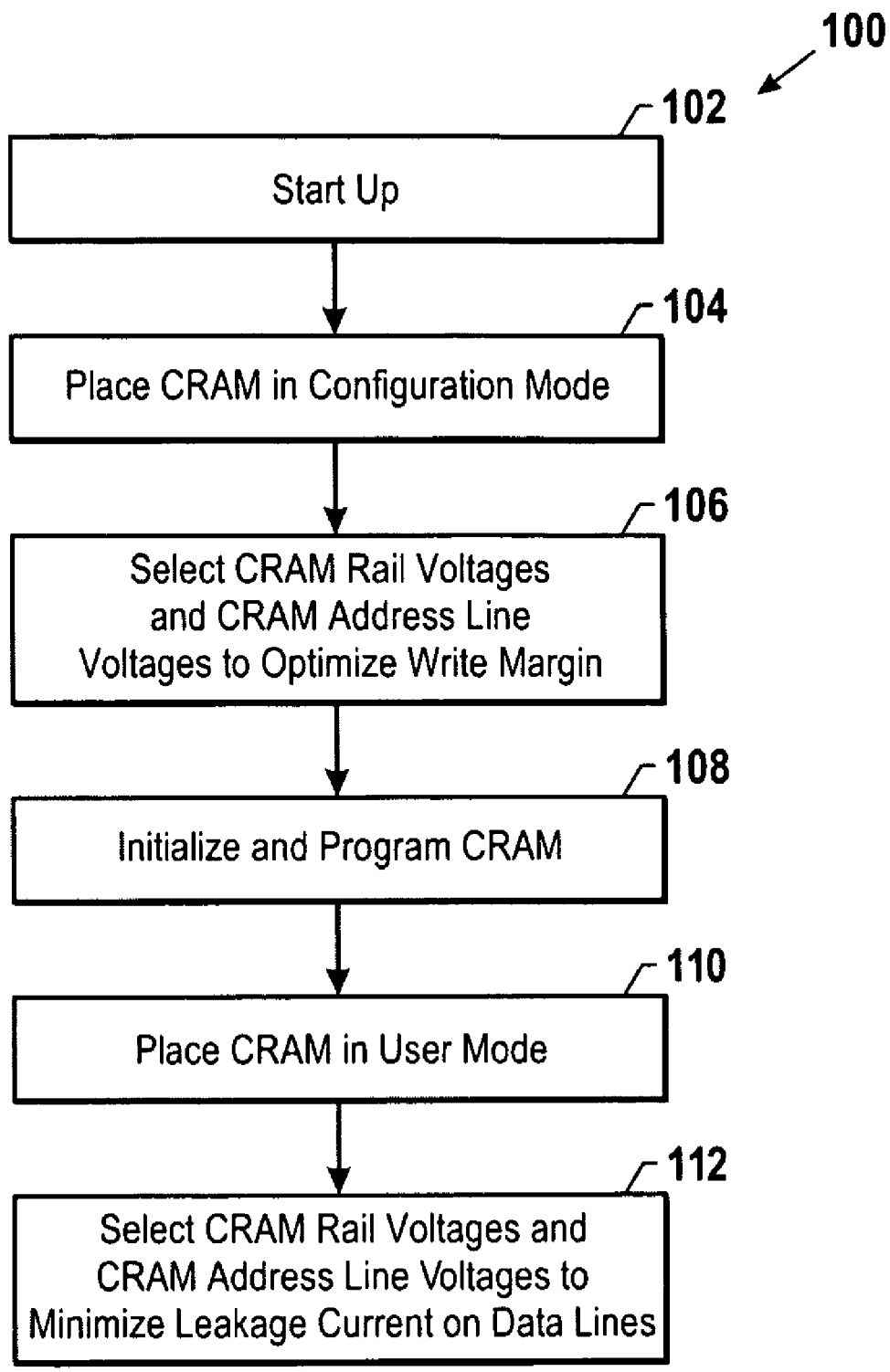
FIG. 11 illustrates a flow chart depicting the operation of the memory cell of FIG. 6.

As a specific example, the various voltages may have the following values: VCCL=0.9 volts; VSS=0.0 volts; VCCHG=1.5 volts; and VSSADG=−0.15 volts. Given these various voltage values and the manner in which these various values are selected via the selection circuit 70 for use with the CRAM memory cell 32, a specific example of CRAM voltages in the configuration mode is illustrated in FIG. 9, and a specific example of CRAM voltages in the user mode is illustrated in FIG. 10. Referring to FIG. 9 and the flow chart 100 of FIG. 11, when the FPGA is powered up (block 102) and placed in the configuration mode (block 104), the rail voltages for the data line driver 37 are 0.9 volts (VCCL) and 0.0 volts (VSS), and the rail voltages for the first and second inverters 46 an 48 are 0.9 volts (VCC_CRG=VCCL) and 0.0 volts (VSS). Similarly, the logical "1" and "0" values for the address line transistor are 1.5 volts (VCC_ADG=VCCHG) and 0.0 volts (VSS_ADG=VSS), and the logical "1" and "0" values for the clear transistor 44 are 1.5 volts (VCCHG) and 0.0 volts (VSS). These various voltages are selected by the selection circuit 70, as described above, to optimize the write margin during configuration (block 106). The CRAM memory cell 32 may then be initialized, programmed and/or verified as described above (block 108).

However, when the CRAM memory cell 32 is switched from the configuration mode to the user mode (block 110), certain voltages change as depicted in Table 1. Specifically, referring to FIG. 10, the positive and negative rail voltage for the data line driver 37 are 0.9 volts (VCCL) and 0.0 volts (VSS), and the positive and negative rail voltages for the first and second inverters 46 and 48 are 1.5 volts (VCC_CRG=VCCHG) and 0.0 volts (VSS). Similarly, the logical "1" and "0" voltages for the address line transistor are 0.9 volts (VCC_ADG=VCCL) and −0.15 volts (VSS_ADG=VSSADG), and the logical "1" and "0" voltages for the clear transistor 44 are 1.5 volts (VCCHG) and 0.0 volts (VSS). These various voltages are selected by the selection circuit 70, as described above, to minimize leakage current on the data lines 38 and to protect the reliability of the memory cell 32 (block 112).

In the above examples, the higher voltage on the address line transistor 40 provides a better write margin when CRAM memory cell 32 is in the configuration mode while the higher voltages on the inverters 46 and 48 improves the soft error rate when the CRAM memory cell 32 is in the user mode. Furthermore, as discussed previously, the slightly negative voltage that drives the address line transistor 40 to the off-state when the CRAM memory cell 32 is in the user mode reduces or eliminates the off-state leakage current, while the lower logical "1" voltage value on the address line transistor 40 ensures that the gate-to-source voltage of the address line transistor 40 does not exceed an acceptable level. This may allow the use of weaker data line retainers and facilitate providing a memory array with less segmenting.

Figure 12:
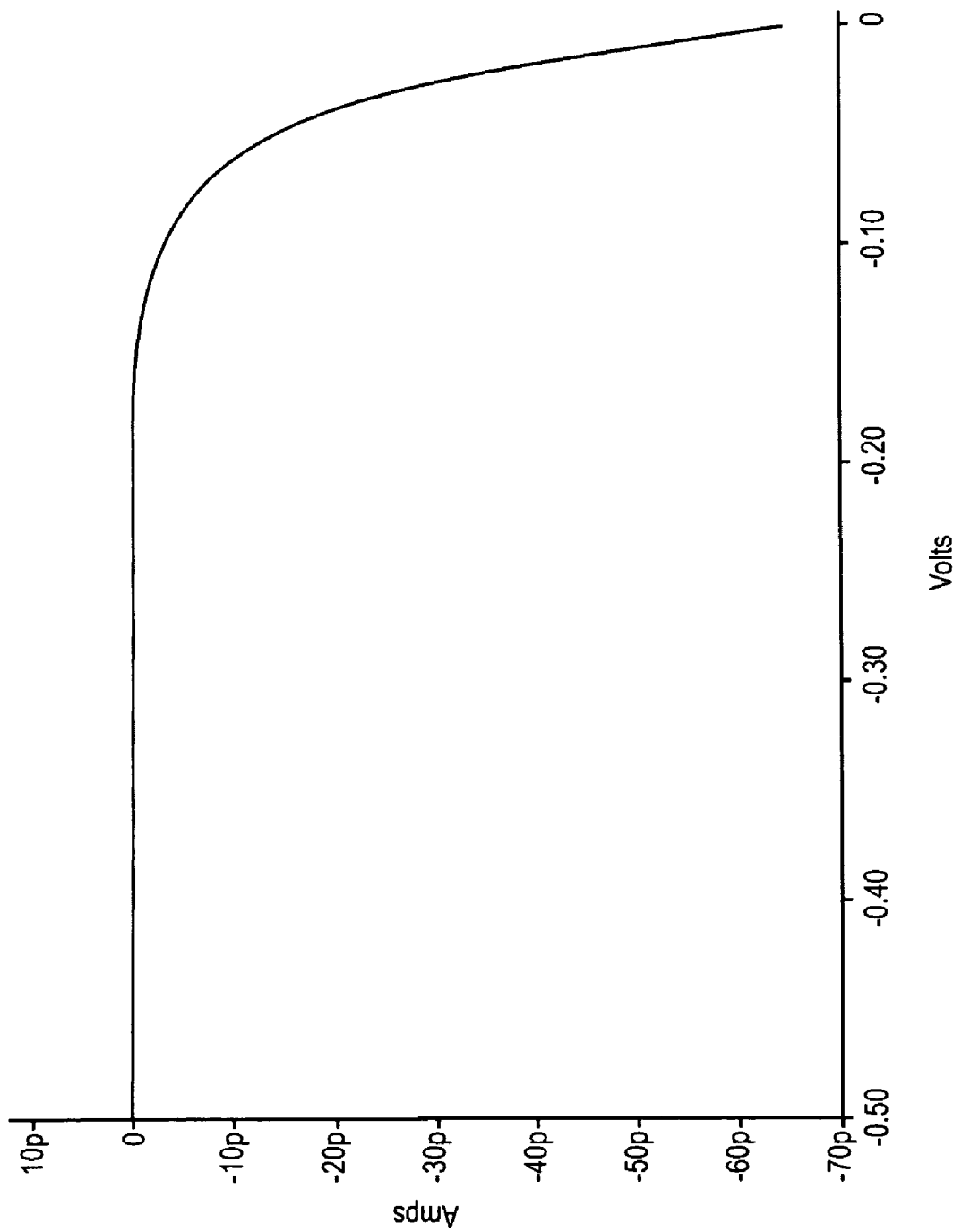
FIG. 12 illustrates an example of leakage current characteristics of the address line transistor of the memory cell of FIG. 6 based on an example simulation.

With regard to the leakage current of the address line transistor 40, one example of the manner in which an overdriven, e.g., slightly negative, off-state voltage may lead to a reduction in the off-state leakage circuit is illustrated in FIG. 12. As can be seen in this example, when the off-state voltage of the address line transistor 40 is at 0.0 volts, the leakage current is approximately 65 pico amps. With a reduction of only 0.05 volts for the off-state voltage, the leakage current reduces to approximately 15 pico amps. Similarly, with an off-state voltage of −0.10 volts, the leakage current reduces to only about 3 pico amps; with an off-state voltage of −0.15 volts, the leakage current reduces to only about 1 pico amp; and with an off-state voltage of −0.2 volts or higher, the leakage current reduces to zero.

While the disclosed memories and techniques may be susceptible to various modifications and alternative forms, specific embodiments have been shown by way of example in the drawings and have been described in detail herein. However, it should be understood that the claims are not intended to be limited to the particular forms disclosed. Rather, the claims are to cover all modifications, equivalents, and alternatives falling within their spirit and scope.

We claim:
1. An integrated circuit comprising:
  a plurality of memory cells, wherein each of the memory cells comprises:
    a memory retention circuit; and
    an address line transistor coupled between a data in line and the memory retention circuit, the address line transistor having a gate coupled to an address line, wherein the address line is adapted to receive an overdrive voltage thereon when the address line transistor is in an off state.

2. The integrated circuit, as set forth in claim 1, wherein the memory retention circuit comprises a first inverter coupled in a serial loop with a second inverter.

3. The integrated circuit, as set forth in claim 1, wherein the address line transistor comprises an NMOS transistor, and wherein the overdrive voltage is a negative voltage.

4. The integrated circuit, as set forth in claim 1, wherein the address line transistor comprises a PMOS transistor, and wherein the overdrive voltage is a positive voltage greater than a positive rail voltage of the memory retention circuit.

5. The integrated circuit, as set forth in claim 1, comprising a voltage selection circuit adapted to select a first set of voltages to be applied to each memory cell when the memory is in a first mode and a different second set of voltages to be applied to each memory cell when the memory is in a second mode.

6. The integrated circuit, as set forth in claim 1, wherein the plurality of memory cells comprises a static random access memory.

7. The integrated circuit, as set forth in claim 1, wherein the plurality of memory cells is adapted to be placed in a configuration mode in which the plurality of memory cells may be programmed and in a user mode in which the plurality of memory cells may be read.

8. The integrated circuit, as set forth in claim 7, wherein the address line is adapted to receive the overdrive voltage thereon only when the plurality of memory cells is in the user mode.

9. The integrated circuit, as set forth in claim 1, wherein the integrated circuit is a programmable logic device.

10. The integrated circuit, as set forth in claim 9, wherein the integrated circuit further comprises a field programmable gate array and the plurality of memory cells is adapted to configure the field programmable gate array.

11. A method of programming an integrated circuit memory, the method comprising:
   initializing the memory;
   after the memory has been initialized, programming the memory; and
   after the memory has been programmed, reading information stored in the memory, wherein the reading comprises delivering an overdrive voltage to address line transistors of the memory.

12. The method, as set forth in claim 11, wherein initializing comprises placing the memory in a configuration mode and clearing the memory.

13. The method, as set forth in claim 12, wherein programming comprises applying a first set of voltages to address lines of a plurality of memory cells of the memory.

14. The method, as set forth in claim 13, wherein reading comprises placing the memory in a user mode and applying a different second set of voltages to the address lines of the plurality of memory cells, the second set of voltages having an off-state voltage adapted to overdrive address line transistors associated with the address lines.

15. The method, as set forth in claim 14, wherein the off-state voltage adapted to overdrive the address line transistors is adapted to substantially eliminate leakage current from the address line transistors while in the off state.

16. A method of manufacturing an integrated circuit, the method comprising:
   providing an integrated circuit having a memory, the memory having a plurality of memory cells, wherein each of the memory cells comprises a memory retention circuit and an address line transistor coupled between a data in line and the memory retention circuit, the address line transistor having a gate coupled to an address line; and
   providing a first set of voltage sources adapted to apply a first set of voltages to the address line transistors of the memory cells during programming of the memory cells and to apply a different second set of voltages to the address line transistors of the memory cells during reading of the memory cells, wherein the second set of voltages comprises an overdrive voltage adapted to place the address line transistors in an off state wherein the address line transistors produce substantially no leakage current.

17. The method, as set forth in claim 16, wherein providing the integrated circuit comprises providing NMOS address line transistors, and wherein providing the second set of voltage sources comprises providing a negative voltage as the overdrive voltage.

18. The method, as set forth in claim 16, wherein providing the integrated circuit comprises providing PMOS address line transistors, and wherein providing the second set of voltage sources comprises providing a positive voltage greater than a positive rail voltage of the memory retention circuit as the overdrive voltage.

19. The method, as set forth in claim 16, wherein providing the integrated circuit comprises providing the memory that is adapted to be placed in a first mode in which the plurality of memory cells may be programmed and in a second mode in which the plurality of memory cells may be read.

20. The method, as set forth in claim 19, wherein providing the second set of voltage sources comprises providing the overdrive voltage only when the memory is in the second mode.

21. The method, as set forth in claim 19, wherein providing the integrated circuit comprises providing a voltage selection circuit adapted to select the first set of voltages when the memory is in the first mode and the second set of voltages when the memory is in the second mode.

22. The method, as set forth in claim 16, wherein providing the second set of voltage sources comprises providing voltages adapted to optimize reliability of the address line transistors.

* * * * *